United States Patent
Eastman et al.

(10) Patent No.: US 11,683,987 B2
(45) Date of Patent: Jun. 20, 2023

(54) ELECTROCALORIC HEAT TRANSFER SYSTEM COMPRISING COPOLYMERS

(71) Applicant: Carrier Corporation, Palm Beach Gardens, FL (US)

(72) Inventors: Scott Alan Eastman, Glastonbury, CT (US); Sergei F. Burlatsky, West Hartford, CT (US); Joseph V. Mantese, Ellington, CT (US); Wei Xie, Manchester, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 645 days.

(21) Appl. No.: 16/623,344

(22) PCT Filed: Jun. 18, 2018

(86) PCT No.: PCT/US2018/038054
§ 371 (c)(1),
(2) Date: Dec. 16, 2019

(87) PCT Pub. No.: WO2018/232394
PCT Pub. Date: Dec. 20, 2018

(65) Prior Publication Data
US 2021/0151655 A1    May 20, 2021

Related U.S. Application Data

(60) Provisional application No. 62/521,169, filed on Jun. 16, 2017.

(51) Int. Cl.
*C08F 220/06* (2006.01)
*F25B 21/00* (2006.01)
(Continued)

(52) U.S. Cl.
CPC ............ *H01L 37/025* (2013.01); *C08F 18/20* (2013.01); *C08F 18/24* (2013.01); *C08F 214/22* (2013.01);
(Continued)

(58) Field of Classification Search
CPC .. F25B 2321/001; F25B 21/00; C08F 214/22; H01L 37/025
See application file for complete search history.

(56) References Cited

U.S. PATENT DOCUMENTS

| 2,990,391 A | 6/1961 | Grantham |
| 3,794,986 A | 2/1974 | Murayama |

(Continued)

FOREIGN PATENT DOCUMENTS

| WO | 2014162080 A1 | 10/2014 |
| WO | 2017030529 A1 | 2/2017 |

(Continued)

OTHER PUBLICATIONS

Chen et al.; "P(VDF-TrFE-CFE) Terpolymer Thin-Film for High Performance Nonvolatile Memory"; Applied Physics Letters; vol. 102, Issue 6; Feb. 11, 2013; 10 Pages.

(Continued)

*Primary Examiner* — Ana M Vazquez
(74) *Attorney, Agent, or Firm* — Cantor Colburn LLP

(57) ABSTRACT

An electrocaloric element for a heat transfer system includes an electrocaloric material of a copolymer of (i) vinylidene fluoride, and (ii) an addition polymerization monomer that is larger than vinylidene fluoride and includes a substituent more electronegative than chlorine. Electrodes are disposed on opposite surfaces of the electrocaloric material, and an electric power source is configured to provide voltage to the electrodes. The system also includes a first thermal flow path between the electrocaloric material and a heat sink, and a (Continued)

second thermal flow path between the electrocaloric material and a heat source.

20 Claims, 1 Drawing Sheet

(51) Int. Cl.
    *C08F 214/22*     (2006.01)
    *C08F 18/20*     (2006.01)
    *C08F 18/24*     (2006.01)
    *C08F 214/28*     (2006.01)
    *C08F 220/56*     (2006.01)
    *C08K 5/00*     (2006.01)
    *H01L 37/02*     (2006.01)
    *H10N 15/10*     (2023.01)

(52) U.S. Cl.
    CPC .......... *C08F 214/28* (2013.01); *C08F 220/06* (2013.01); *C08F 220/56* (2013.01); *C08K 5/0083* (2013.01); *F25B 21/00* (2013.01); *F25B 2321/001* (2013.01)

(56) References Cited

U.S. PATENT DOCUMENTS

| | | | |
|---|---|---|---|
| 6,355,749 B1 | 3/2002 | Chung et al. | |
| 6,423,412 B1 | 7/2002 | Zhang et al. | |
| 7,078,101 B1 | 7/2006 | Ramotowski et al. | |
| 8,344,585 B2 | 1/2013 | Erbil et al. | |
| 8,552,623 B2 | 10/2013 | Choi et al. | |
| 8,564,181 B2 | 10/2013 | Choi et al. | |
| 8,869,542 B2 | 10/2014 | Zhang et al. | |
| 9,671,140 B2 * | 6/2017 | Kruglick | F25B 21/00 |
| 2003/0089894 A1 | 5/2003 | Molnar et al. | |
| 2009/0030152 A1 | 1/2009 | Zhang et al. | |
| 2011/0016885 A1 | 1/2011 | Zhang et al. | |
| 2011/0082271 A1 | 4/2011 | Brinati et al. | |
| 2012/0178880 A1 | 7/2012 | Zhang et al. | |
| 2015/0027132 A1 | 1/2015 | Zhang et al. | |
| 2015/0033762 A1 | 2/2015 | Cheng et al. | |
| 2015/0119523 A1 | 4/2015 | Ameduri et al. | |
| 2016/0028327 A1 | 1/2016 | Aliane | |
| 2016/0071852 A1 | 3/2016 | Domingues Dos Santos et al. | |
| 2016/0076798 A1 | 3/2016 | Zhang et al. | |
| 2016/0087185 A1 | 3/2016 | Cheng | |
| 2016/0145414 A1 | 5/2016 | Capsal et al. | |
| 2016/0225775 A1 * | 8/2016 | Park | H01L 21/321 |
| 2017/0141291 A1 | 5/2017 | Aliane et al. | |

FOREIGN PATENT DOCUMENTS

| | | |
|---|---|---|
| WO | 2018004518 A1 | 1/2018 |
| WO | 2018004520 A1 | 1/2018 |

OTHER PUBLICATIONS

International Search Report Issued in International Application No. PCT/US2018/038054 dated Sep. 20, 2018; 6 Pages.
Jiang et al.; "High 3 Phase Content in PVDF/CoFe2O4 Nanocomposites Induced by DC Magnetic Fields"; Applied Physical Letters; vol. 109, Issue 10; 2016; 10 Pages.
Rožič et al.; "Electrocaloric Effect in the Relaxor Ferroelectric Terpolymer P(VDF-TrFE-CFE)"; Ferroelectrics; vol. 422, Issue 1; 2011; pp. 81-85.
Written Opinion Issued in International Application No. PCT/US2018/038054 dated Sep. 20, 2018; 8 Pages.
Yu et al.; "Energy Barriers for Dipole Moment Flipping in PVDF-Related Ferroelectric Polymers"; The Journal of Chemical Physics; vol. 144; Jan. 6, 2016; pp. 014901-1-014901-7.
Zhang et al.; "Ferroelectric Polymer Nanocomposites for Room-Temperature Electrocaloric Refrigeration"; Advanced Materials; vol. 27; 2015; pp. 1450-1454.
Chinese Office Action dated Feb. 16, 2023 in corresponding Chinese application No. 201880052937.X.

* cited by examiner

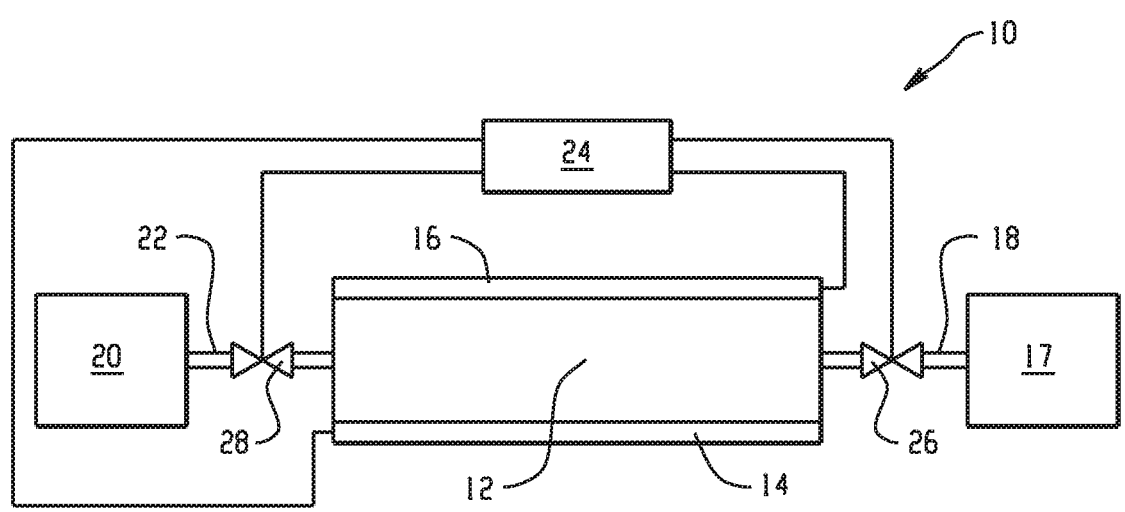

ELECTROCALORIC HEAT TRANSFER SYSTEM COMPRISING COPOLYMERS

CROSS-REFERENCE TO RELATED APPLICATIONS

This application is the National Stage of International Patent Application No. PCT/US2018/038054 filed Jun. 18, 2018, which claims priority to U.S. Provisional Patent Application No. 62/521,169 filed Jun. 16, 2017, the disclosure of which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops.

BRIEF DESCRIPTION

In some embodiments of the disclosure, a heat transfer system comprises an electrocaloric material, which comprises a copolymer of a monomer mixture. The monomer mixture comprises (i) vinylidene fluoride, and (ii) an addition polymerization monomer that is larger than vinylidene fluoride and includes a substituent more electronegative than chlorine. Electrodes are disposed on opposite surfaces of the electrocaloric material, and an electric power source is configured to provide voltage to the electrodes. The system also includes a first thermal flow path between the electrocaloric material and a heat sink, and a second thermal flow path between the electrocaloric material and a heat source.

In some embodiments, the heat transfer system further comprises a controller configured to selectively apply voltage to activate the electrodes in coordination with heat transfer along the first and second thermal flow paths to transfer heat from the heat source to the heat sink.

In any one or combination of the foregoing embodiments, the monomer mixture can further comprise: (iii) an addition polymerization monomer selected from hexafluoropropylene, tetrafluoroethylene, trifluoroethylene, or an addition polymerization monomer smaller than trifluoroethylene.

In some embodiments, the addition polymerization monomer (iii) comprises trifluoroethylene.

In some embodiments, the addition polymerization monomer (iii) comprises tetrafluoroethylene.

In some embodiments, the addition polymerization monomer (iii) comprises an addition polymerization monomer smaller than trifluoroethylene.

In some embodiments, the addition polymerization monomer (iii) comprises vinyl fluoride or ethylene.

In any one or combination of the foregoing embodiments, the electrocaloric material further comprises a β-phase promoting additive.

In some embodiments, the β-phase promoting additive comprises a nucleating agent having a polar surface charge or electrocalorically active solid particles.

In any one or combination of the foregoing embodiments, the monomer (ii) is selected from vinyl chloroformate, vinyl trifluoroacetate, vinyl acetate, vinyl benzoate, 2,vinyl-1,3-doxolane, n-vinylformamide, 2-vinylpyridine, 1-vinyl-2-pyrrolidonone, acrylonitrile, 1-cyanovinyl acetate, methacrylamide, acrylamide, methyl (meth)acrylate.

In some embodiments, the addition polymerization monomer (ii) is according to the formula:

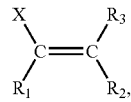

wherein
X is a substituent more electronegative than chlorine, $-R_1$, $-R_2$, and $-R_3$ are each independently $-H$, $-F$, or $-C(R_4)_3$, and $R_4$ is H or F.

In some embodiments, $R_1$ is F and $R_2$ and $R_3$ are each H.

In some embodiments, $R_1$, $R_2$, and $R_3$ are each F.

In any one or combination of the foregoing embodiments, the substituent more electronegative than chlorine is selected from $-O-C(O)-R_5$, $-NH-C(O)-R_6$, $-C(O)-NHR_6$, cyano, or a heterocyclic group.

In any one or combination of the foregoing embodiments, the copolymer comprises an ordered distribution of units derived from monomer (ii) along the copolymer polymer backbone.

In any one or combination of the foregoing embodiments, the copolymer polymer includes segments of monomer units comprising an ordered distribution of units derived from monomer (ii).

In any one or combination of the foregoing embodiments, the copolymer comprises an ordered distribution of units derived from monomer (ii) along the entirety of the copolymer backbone.

In any one or combination of the foregoing embodiments, the ordered distribution of units derived from monomer (ii) comprises a uniform distribution of units derived from monomer (ii) along the polymer backbone.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

The FIGURE is a schematic depiction of an exemplary heat transfer system as described herein.

DETAILED DESCRIPTION

As mentioned above, the heat transfer system utilizes an electrocaloric material that is a copolymer of a monomer mixture comprising (i) vinylidene fluoride (VF), and (ii) an addition polymerization monomer that is larger than vinylidene fluoride and includes a substituent more electronegative than chlorine. Examples of the monomer (ii) include, but are not limited to vinyl chloroformate, vinyl trifluoroacetate, vinyl acetate, vinyl benzoate, 1,1-dihloroethylene, 2-vinyl-1,3-dioxolane, n-vinylformamjide, 2-vinylpyridine, 1-vinyl-2-pyrrolidinone, acrylonitrile, 1-cyanovinyl acetate, methacrylamide, acrylamide, methyl methacrylate. In some embodiments, the monomer (ii) can be represented by the formula:

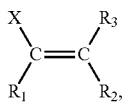

wherein
X is a substituent more electronegative than chlorine, $-R_1$, $-R_2$, and $-R_3$ are each independently $-H$, $-F$, or $-C(R_4)_3$, and $R_4$ is H or F. In the above formula, various configurations of $R_1$, $R_2$, and $R_3$ can be utilized. For example, in some embodiments, $R_1$ is F and $R_2$ and $R_3$ are each H. In some embodiments, $R_1$, $R_2$, and $R_3$ are each F.

In the above formula, X represents a substituent more electronegative than chlorine. As used herein the term "electronegative" and expressions regarding relative electronegativity refer to Pauling electronegativity, which utilizes bond dissociation energies and other aspects of valence bond theory to provide a dimensionless electronegativity value. Examples of electronegative groups having a substituent more electronegative than chlorine include $OClO_2$, OCN, OClO, $NO_2$, $ONO_2$, NCO, NO, ONO, $N_3$, OCl, NCS, OF, SCN, CN, $P(=O)F_2$, PO, $OCF_3$, $C_6H_2(NO_2)_3$, $NF_2$, $P(=O)(OH)_2$, $CH=CHC_6H_2(NO_2)_3$, OCHO, OH, COOH, $CF_3$, OBr, $CF_2CF_3$, $CF(CF_3)_2$, $C_6H_3(NO_2)_2$, $SiF_3$, $P(=O)Cl_2$, $PF_2$, $GeF_3$, $CH(CF_3)_2$, $CH=CHC_6H_3(NO_2)_2$, NHOH, $NCl_2$, CHO, $SnF_3$, $P(=O)Br_2$, or $S(=O)_2CH_3$. In some embodiments, the substituent more electronegative than chlorine is selected from $-O-C(O)-R_5$, $-NH-C(O)-R_6$, $-C(O)-NHR_6$, cyano, or a heterocyclic group.

In some embodiments, the monomer mixture further comprises (iii) an addition polymerization monomer selected from tetrafluoroethylene, trifluoroethylene, or an addition polymerization monomer smaller than trifluoroethylene. In some embodiments, the monomer (iii) comprises TrFE. In some embodiments, the monomer (iii) comprises tetrafluoroethylene (TFE). In some embodiments, the monomer (iii) comprises a monomer smaller than TrFE, such as vinyl fluoride (VF) or ethylene. In some embodiments, the monomer (iii) comprises a combination of two or more of the above monomers. In some embodiments, the monomer (iii) can provide a technical effect of promoting the formation of β-phase polymer, which can have a strong electrocaloric effect. The amounts of the respective monomers in the copolymer can vary depending on desired properties of the copolymer. In some example embodiments, the monomer (ii) can be present in the monomer composition in an amount in a range having a low end of 1 mole %, or 2 mole %, or 3 mole %, or 4 mole %, or 4 mole %, or 6 mole %, and an upper end of 12 mole %, or 10 mole %, or 8 mole %, based on the total amount of monomer mixture. In some embodiments, the balance of the monomer mixture can be made up of monomers (i), or monomers (i) and (iii). In embodiments where monomers (i) and (iii) are both present, the molar ratio of the amounts of monomers (i):(iii) can range from greater than zero to 1:1. In some embodiments, the monomer (ii) can provide a technical effect of promoting a critical temperature (Tc) for the polymer in a range that is useful for air conditioning applications at ambient temperatures. In some embodiments, the presence of a substituent with electronegativity greater than chlorine can provide a technical effect of promoting a target Tc with lower amounts of monomer compared to other monomers such as chlorofluoroethene. In some embodiments, the monomer (ii) can be present in the monomer composition in an amount in a range having a low end of 1 mole % or 2 mole %, and an upper end of 5 mole %, or 4.5 mole %, or 4 mole %, based on the total amount of monomer mixture. The above upper and lower range endpoints of any of the above ranges in this paragraph can be independently combined to disclose a number of different ranges, and each possible range is expressly hereby disclosed.

In some embodiments, the electrocaloric material can include a β=phase promoter, either in addition to or as an alternative to the presence of monomer (iii) in the monomer mixture. The additive can include an additive selected from a nucleating agent having a polar surface charge, electrocalorically active solid particles, or a combination thereof, according to patent application PCT/US2016/039620, the disclosure of which is incorporated herein by reference in its entirety. Various types of nucleating agents can be used. In some embodiments, the nucleating agent is a molecular compound. Many such molecular nucleating agents are known and are commercially available. In some embodiments, the nucleating agent can be solid particles. In some embodiments, the nucleating agent has a positive surface charge. In some embodiments, the electrocaloric material can include both positive surface charge and negative surface charge nucleating agents, or a nucleating agent having surface portion(s) with positive charge and surface portions with negative charge.

Positive molecular nucleation agents can be made up of ionic liquids, molten salts, or salts which have a crystallization temperature above the crystallization point of PVDF (nominally 140° C.). Some examples of positive nucleating agents include tetrabutylphosphonium hexafluorophosphate, ethyltriphenylphosphonium bromide, n-heptyltriphenylphosphonium bromide, n-acetonylpyridinium bromide, 1-butyl-1-methylpyrrolidinium bromide, or triphenylsulfonium tetrafluoroborate. Negative nucleation agents can be made up of organic salts which have a crystallization temperature above the crystallization point of PVDF (nominally 140° C.). Some examples negative nucleating agents include sodium lauryl sulfate, sodium n-tridecyl sulfate, or 1-naphthyl phosphate monosodium salt monohydrate. Although this disclosure is not dependent on or limited by any particular mechanism or theory, a polar surface charge of the nucleating agent can in some embodiments promote formation of polar (3 or y crystalline phases that can contribute to electrocaloric effect. In some embodiments, the nucleating agent has a lower solubility in a casting solvent than does the electrocaloric copolymer, which can promote precipitation of the nucleating agent before the copolymer for nucleation effect. In some embodiments, the nucleating agent has a higher melting point than the electrocaloric copolymer.

Molecular nucleating agents can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film Solid particles such as clays can also be used as nucleating agents. Examples of nanoparticle nucleating agents include but are not limited to Montmorilonite, kaolinite, halloysite boron nitride, silcon nitride, mica, silica, alumina, talc, titanium dioxide, and polytetrafluoroethyene. Some solid particulate nucleating agents may contain an inherent polar surface charge, and any solid particulate nucleating can also be processed with surface treatments such as silanes, phosphates and other salts, acids, amines, epoxides, or ionic liquids to impart a polar surface charge. Solid particle nucleating agents can have particle size ranges in a range having a low end of 1 nm, more specifically 3 nm, more specifically 5 nm, and an upper end of 1000 nm, more specifically 700 nm, more specifically 500 nm, more specifically 300 nm, and even more specifically 100 nm. Solid particle nucleating agents can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film.

The additive can also include electrocalorically active filler particles. The particles can be sized in the conventional polymer filler size range to promote electrocaloric activity of the electrocaloric material, or can be in the nanoscopic range as described above for nanoparticle nucleating agents, which can promote nucleation in addition promoting electrocaloric activity. Examples of materials for electrocalorically active filler particles include but are not limited to barium strontium titanate, barium zirconium titanate, lead zirconate, barium titanate, lead manganese niobate-lead titanate mixtures, aluminum nitride, gallium nitride and its alloys, zinc oxide, and lithium niobate or lithium tantalite. Electrocalorically active filler particles can have particle size ranges in a range having a low end of 1 nm, more specifically 3 nm, and more specifically 5 nm, and an upper end that can be as defined above for solid particle nucleating agents (e.g., which particles can perform a dual function of providing electrocaloric effect and providing nucleation for the copolymer), or can extend to higher upper limits of end of 10 μm, more specifically 5 μm, and more specifically 1 μm. Electrocalorically active filler particles can be used in amounts in a range having a low end of 0.001 wt. %, more specifically 0.05 wt. %, and more specifically 0.1 wt. %, and an upper end of 15 wt. %, more specifically 10 wt. %, and more specifically 5 wt. %, with percentages based on the total weight of the solid film.

In some embodiments, the copolymer comprises an ordered distribution of units derived from monomer (ii) along the copolymer polymer backbone. In some embodiments, an ordered distribution of monomer units (ii) can have the technical effect of promoting a narrower electrocaloric transition. If the transition is broader than the total temperature change in the system, there is electrocaloric effect that is essentially not being utilized (i.e. reduction in electrocaloric efficiency). If the transition is narrow enough that it is completely within the range of temperatures seen in the system during operation, the electrocaloric efficiency of the material is maximized. In some embodiments, the ordered distribution of monomer units (ii) can be a uniform distribution (i.e., a repeating substantially equal number of monomer repeat units between adjacent monomer (ii) units). In some embodiments, the ordered distribution of monomer units (ii) is exhibited by a portion of the copolymer or in multiple segments of the copolymer. In some embodiments, the ordered distribution of monomer (ii) units is exhibited along the entirety of the copolymer. Distribution of monomer units (ii) along the copolymer backbone can be achieved by synthesizing oligomers from the other monomer(s), and reacting the oligomers with the monomer (ii) units under conditions to promote attachment of the monomer (ii) units to the oligomer chain (e.g., a stoichiometric excess of oligomer), and then further controlled chain extension to assemble copolymer macromolecules having a controlled distribution of monomer (ii) units along the copolymer backbone.

The addition polymerization reaction to form the electrocaloric copolymers can be performed using various addition polymerization techniques and combinations of techniques, including but not limited to emulsion polymerization, telomerisation, controlled addition polymerization. Various additives can be included in the reaction mixture, such as emulsifiers, aqueous and organic solvents, free radical initiators, chain transfer agents, etc. In some embodiments, an electric field or space- or time-differentiated pattern of electric fields can be applied to the reaction mixture during polymerization to impact the crystal structure of the polymer, or the alignment of the molecules or dipoles on the molecules. In some embodiments, the electrocaloric material can be made by the dissolving or dispersing the electrocaloric copolymer(s) in an organic solvent to form a liquid composition, casting the liquid composition onto a substrate, evaporating the solvent to form an electrocaloric film, and removing the electrocaloric film from the substrate. In some embodiments, the solvent(s) can have a boiling point of less than 100° C., more specifically less than 80° C., and even more specifically 70° C. In some embodiments, the solvent can have a boiling point of at least 50° C., more specifically 55° C., and even more specifically 60° C. It is understood that these upper and lower range limits can be independently combined to disclose a number of different possible ranges. As used herein, unless otherwise explicitly stated boiling point means boiling point at 1 atmosphere pressure.

With respect to the solvent, various organic solvents can be used. In some embodiments, a polar organic solvent is used, and can in some aspects provide compatibility with the polarity of the electrocaloric polymer. In other embodiments, a non-polar organic solvent can be used. Mixtures of polar and non-polar organic solvents can also be used. Examples of solvents include but are not limited to tetrahydrofuran (THF), butanone (i.e., methylethyl ketone or MEK), chlorobenzene, supercritical $CO_2$.

The concentration of the electrocaloric polymer in a solvent coating composition can vary widely, depending on the type of coating technique and the desired dried thickness of the coating. In some embodiments, the electrocaloric polymer content range from a lower endpoint of 0.1 wt. %, more specifically 1 wt. %, to an upper endpoint of 50 wt. %, more specifically 20 wt. %, based on the total weight of the coating composition, it being understood that the above endpoints can be independently combined to yield a number of different ranges.

In some embodiments, forming and solidifying the film can comprise forming a thermoplastic fluid melt comprising the electrocaloric copolymer, forming a film of the thermoplastic fluid melt, and cooling to solidify the film. In some embodiments, the thermoplastic fluid melt can be extruded as a film into a cooling medium, blow-molded using film-forming blow-molding techniques, or coated onto a substrate.

In some embodiments, a method of making a heat transfer system comprises making an electrocaloric element according to any one or combination of the above method embodiments, and further comprising providing a heat flow path between the electrocaloric element and a heat source or a heat sink for controlled heat transfer between the electrocaloric element and the heat source or heat sink.

According to the method, the fluid composition is formed into a solid film comprising the electrocaloric copolymer. The film is disposed between electrodes (e.g., by applying electrodes onto the film using ink deposition or other techniques to form the electrocaloric element.

In some embodiments, the cast fluid composition can be subjected to a constant or a varying electric field during casting, evaporation, annealing, or physical manipulation (e.g., stretching) to impact the alignment of the polymer macromolecules and polar substituents in crystalline domains. After the film is dried and removed from the substrate, it can optionally be subjected to an annealing process by heating. The electrocaloric material can be subjected to various processing other protocols to promote or otherwise impact the electrocaloric effect of the material or other properties. In some embodiments, the solid film can be subjected to stretching or other physical manipulations (before, during, or after annealing), which can impact the alignment of the polymer macromolecules and polar substituents in crystalline domains.

The fluid copolymer composition can include additives and coating aids such as surfactants, lubricants, substrate release agents, stabilizers, antioxidants, and others can be included. Various substrates can be used, including but not limited to glass, polished stainless steel, or solvent-resistant polymers (polytetrafluoroethylene) or polymers that are dissolvable in solvents other than the solvent used for coating the electrocaloric polymer (e.g., polypropylene). Release of the electrocaloric film can be facilitated by functionalization of the substrate using low surface-energy liquids such as polyorganosiloxanes or by dissolving a polymer substrate in a solvent that doesn't dissolve the coated electrocaloric film (e.g., a non-polar organic solvent). In some embodiments, the substrate can include an additive such as a nucleating agent at the interface surface with the copolymer, for example solid particle nucleating agents on the substrate surface or in the substrate at the surface, or pre-treatment of the substrate surface with a solution or dispersion of a molecular nucleating agent.

An example embodiment of a heat transfer system and its operation are further described with respect to the FIGURE. As shown in the FIGURE, a heat transfer system 10 comprises an electrocaloric element comprising an electrocaloric polymer film 12 having electrodes 14 and 16 on opposite sides thereof. Multiple electrocaloric elements configured in a stack can also be used. The electrocaloric element is in thermal communication with a heat sink 17 through a first thermal flow path 18, and in thermal communication with a heat source 20 through a second thermal flow path 22. The thermal flow paths are described below with respect thermal transfer through flow of a heat transfer fluid through control valves 26 and 28 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 24 serves as an electrical power source and is configured to control electrical current to through a power source (not shown) to selectively activate the electrodes 14, 16. The controller 24 is also configured to open and close control valves 26 and 28 to selectively direct the heat transfer fluid along the first and second flow paths 18 and 22.

In operation, the system 10 can be operated by the controller 24 applying an electric field as a voltage differential across the electrocaloric element to cause a decrease in entropy and a release of heat energy by the electrocaloric elements. The controller 24 opens the control valve 26 to transfer at least a portion of the released heat energy along flow path 18 to heat sink 17. This transfer of heat can occur after the temperature of the electrocaloric elements has risen to a threshold temperature. In some embodiments, heat transfer to the heat sink 17 is begun as soon as the temperature of the electrocaloric elements increases to be about equal to the temperature of the heat sink 17. After application of the electric field for a time to induce a desired release and transfer of heat energy from the electrocaloric elements to the heat sink 17, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 20. The controller 24 closes control valve 26 to terminate flow along flow path 18, and opens control device 28 to transfer heat energy from the heat source 20 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 24 opens control valve 26 to transfer heat from the electrocaloric elements to the heat sink 17 until a second temperature threshold is reached. The electric field can continue to be applied during all or a portion of the time period between the first and second temperature thresholds, and is then removed to reduce the temperature of the electrocaloric elements until a third temperature threshold is reached. The controller 24 then closes control valve 26 to terminate heat flow transfer along heat flow path 18, and opens control valve 28 to transfer heat from the heat source 20 to the electrocaloric elements. The above steps can be optionally repeated until a target temperature of the conditioned space or thermal target (which can be either the heat source or the heat sink) is reached.

The systems described herein can be operated in a cooling mode where the heat source is a conditioned space or cooling target. The systems described herein can also be operated in a heat pump mode where the heat sink is a conditioned space or heating target. It should also be noted that the described systems are exemplary in nature and that modifications can of course be made. For example, a single controller 24 is in the FIGURE, but control could be provided by distributed control or smart components such as temperature-sensitive heat transfer control devices. Also, although the systems are depicted with a single electrocaloric material and electrode assembly, it is understood by the skilled person that connected banks or arrays of elements can be used as well.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A heat transfer system, comprising:
an electrocaloric material comprising:
a copolymer of a monomer mixture comprising:
(i) vinylidene fluoride, and
(ii) an addition polymerization monomer that is larger than vinylidene fluoride and includes a substituent more electronegative than chlorine;
electrodes disposed on opposite surfaces of the electrocaloric material;
a first thermal flow path between the electrocaloric material and a heat sink;
a second thermal flow path between the electrocaloric material and a heat source; and
an electric power source configured to provide voltage to the electrodes.

2. The heat transfer system of claim 1, further comprising a controller configured to selectively apply voltage to activate the electrodes in coordination with heat transfer along the first and second thermal flow paths to transfer heat from the heat source to the heat sink.

3. The heat transfer system of claim 1, wherein the monomer mixture further comprises: (iii) an addition polymerization monomer selected from hexafluoropropylene, tetrafluoroethylene, trifluoroethylene, or an addition polymerization monomer smaller than trifluoroethylene.

4. The heat transfer system of claim 3, wherein the addition polymerization monomer (iii) comprises trifluoroethylene.

5. The heat transfer system of claim 3, wherein the addition polymerization monomer (iii) comprises tetrafluoroethylene.

6. The heat transfer system of claim 3, wherein the addition polymerization monomer (iii) comprises an addition polymerization monomer smaller than trifluoroethylene.

7. The heat transfer system of claim 6, wherein the addition polymerization monomer (iii) comprises vinyl fluoride or ethylene.

8. The heat transfer system of claim 1, wherein the electrocaloric material further comprises a β-phase promoting additive.

9. The heat transfer system of claim 8, wherein the β-phase promoting additive comprises a nucleating agent having a polar surface charge or electrocalorically active solid particles.

10. The heat transfer system of claim 1, wherein the monomer (ii) is selected from vinyl chloroformate, vinyl trifluoroacetate, vinyl acetate, vinyl benzoate, 2,vinyl-1,3-doxolane, n-vinylformamide, 2-vinylpyridine, 1-vinyl-2-pyrrolidonone, acrylonitrile, 1-cyanovinyl acetate, methacrylamide, acrylamide, methyl (meth)acrylate.

11. The heat transfer system of claim 1, wherein the addition polymerization monomer (ii) is according to the formula:

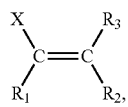

wherein
X is a substituent more electronegative than chlorine, —$R_1$, —$R_2$, and —$R_3$ are each independently —H, —F, or —C($R_4$)$_3$, and $R_4$ is H or F.

12. The heat transfer system of claim 11, wherein $R_1$ is F and $R_2$ and $R_3$ are each H.

13. The heat transfer system of claim 11, wherein $R_1$, $R_2$, and $R_3$ are each F.

14. The heat transfer system of claim 11, wherein X is selected from $OClO_2$, OCN, OClO, $NO_2$, $ONO_2$, NCO, NO, ONO, $N_3$, OCl, NCS, OF, SCN, CN, P(=O)$F_2$, PO, $OCF_3$, $C_6H_2(NO_2)_3$, $NF_2$, P(=O)(OH)$_2$, CH=CHC$_6$H$_2$(NO$_2$)$_3$, OCHO, OH, COOH, $CF_3$, OBr, $CF_2CF_3$, CF(CF$_3$)$_2$, $C_6H_3$(NO$_2$)$_2$, $SiF_3$, P(=O)Cl$_2$, $PF_2$, $GeF_3$, CH(CF$_3$)$_2$, CH=CHC$_6$H$_3$(NO$_2$)$_2$, NHOH, $NCl_2$, CHO, $SnF_3$, P(=O)Br$_2$, S(=O)$_2$CH$_3$, —O—C(O)—$R_5$, —NH—C(O)—$R_6$, —C(O)—NHR$_6$, cyano, or a heterocyclic group.

15. The heat transfer system of claim 1, wherein the substituent more electronegative than chlorine is selected from —O—C(O)—$R_5$, —NH—C(O)—$R_6$, —C(O)—NHR$_6$, cyano, or a heterocyclic group.

16. The heat transfer system of claim 1, wherein the copolymer comprises an ordered distribution of units derived from monomer (ii) along the copolymer polymer backbone.

17. The heat transfer system of claim 15, wherein the copolymer polymer includes segments of monomer units comprising an ordered distribution of units derived from monomer (ii).

18. The heat transfer system of claim 15, wherein the copolymer comprises an ordered distribution of units derived from monomer (ii) along the entirety of the copolymer backbone.

19. The heat transfer system of claim 17, wherein the ordered distribution of units derived from monomer (ii) comprises a uniform distribution of units derived from monomer (ii) along the polymer backbone.

20. The heat transfer system of claim 1, wherein the monomer (ii) is selected from vinyl chloroformate, vinyl trifluoroacetate, vinyl acetate, vinyl benzoate, 2,vinyl-1,3-doxolane, n-vinylformamide, 2-vinylpyridine, 1-vinyl-2-pyrrolidonone, acrylonitrile, 1-cyanovinyl acetate, methacrylamide, acrylamide, methyl (meth)acrylate.

* * * * *